United States Patent [19]

Yoshida et al.

[11] Patent Number: 5,067,119
[45] Date of Patent: Nov. 19, 1991

[54] RECORDING MEDIUM PLAYING APPARATUS WITH AUTOMATIC TONAL RESPONSE SETTING FUNCTION

[75] Inventors: Masayuki Yoshida; Junichi Yoshio; Osamu Watanabe, all of Tokorozawa, Japan

[73] Assignee: Pioneer Electronic Corporation, Tokyo, Japan

[21] Appl. No.: 688,798

[22] Filed: Apr. 22, 1991

Related U.S. Application Data

[62] Division of Ser. No. 442,769, Nov. 29, 1989.

[30] Foreign Application Priority Data

Jun. 1, 1989 [JP] Japan ................... 1-139434

[51] Int. Cl.$^5$ ................... G11B 7/00
[52] U.S. Cl. ................... 369/47; 369/48; 360/27; 84/622
[58] Field of Search ................... 84/622, 627, 604; 369/58, 47, 48; 360/27

[56] References Cited

U.S. PATENT DOCUMENTS

| | | | |
|---|---|---|---|
| 4,072,078 | 2/1978 | Shallenberger et al. | 84/611 |
| 4,375,776 | 3/1983 | Okamoto | 84/602 |
| 4,656,535 | 4/1987 | Usui | 360/27 X |

Primary Examiner—Robert L. Richardson
Attorney, Agent, or Firm—Sughrue, Mion, Zinn, Macpeak & Seas

[57] ABSTRACT

A recording media playing apparatus including tonal response control circuit configured to control the tone of reproduced sounds, by controlling signal levels of frequency components in a plurality of frequency bands, which are set to divide the frequency range of audio signals read out from the recording media, to designated variation ratios. The apparatus further comprises a memory device, a memory control device for storing, in response to a reproducing-tone memorizing command, data representing the variation ratios in the memory device correspondingly to identification information of each of the recording media, the data representing the variation ratios being stored as tone data, and a tonal response setting device for reading out the tone data using the identification information, the tone data corresponding to a recording medium to be played, and subsequently supplying the variation ratios represented by the tone data to the tonal response control circuit, thereby setting the tone of the reproduced sound. With this arrangement, the tonal response of the apparatus can be set automatically according to the type of music selections to be played.

4 Claims, 5 Drawing Sheets

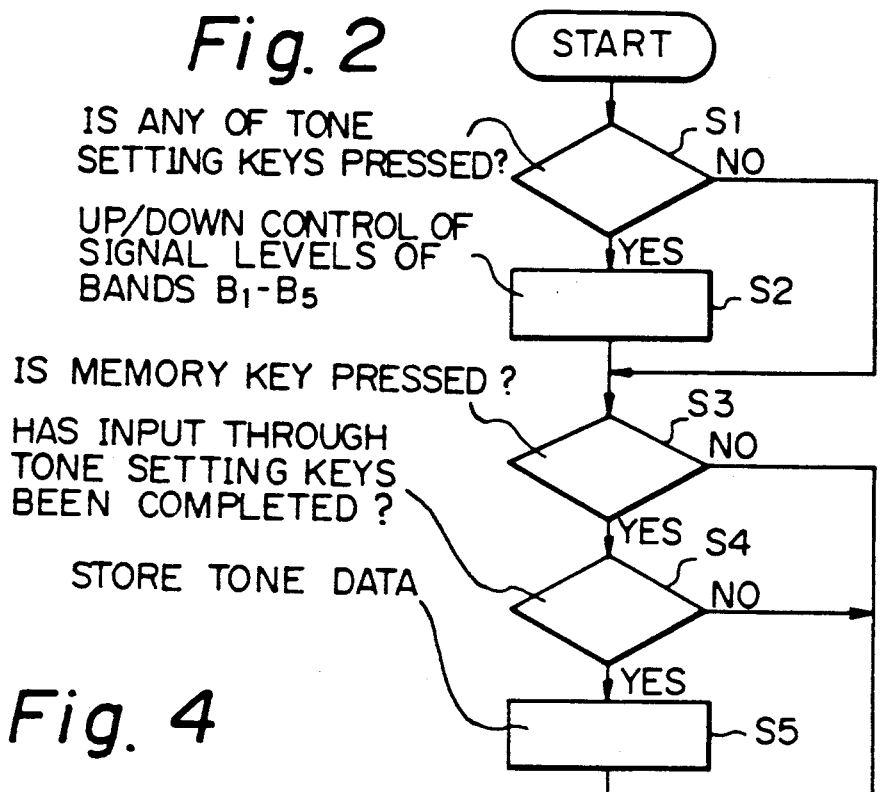
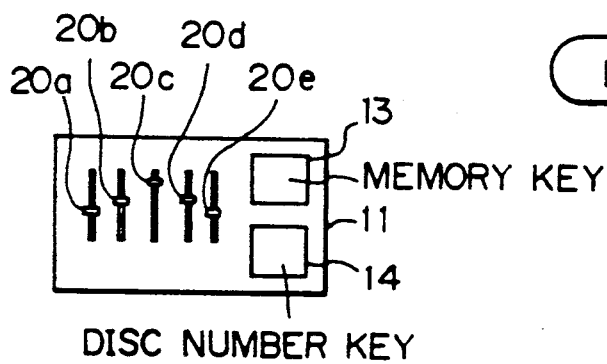
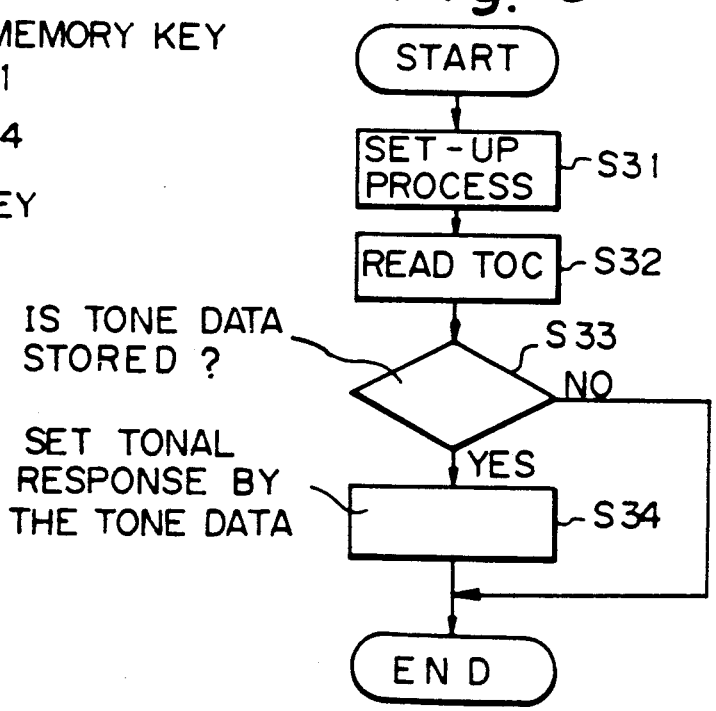

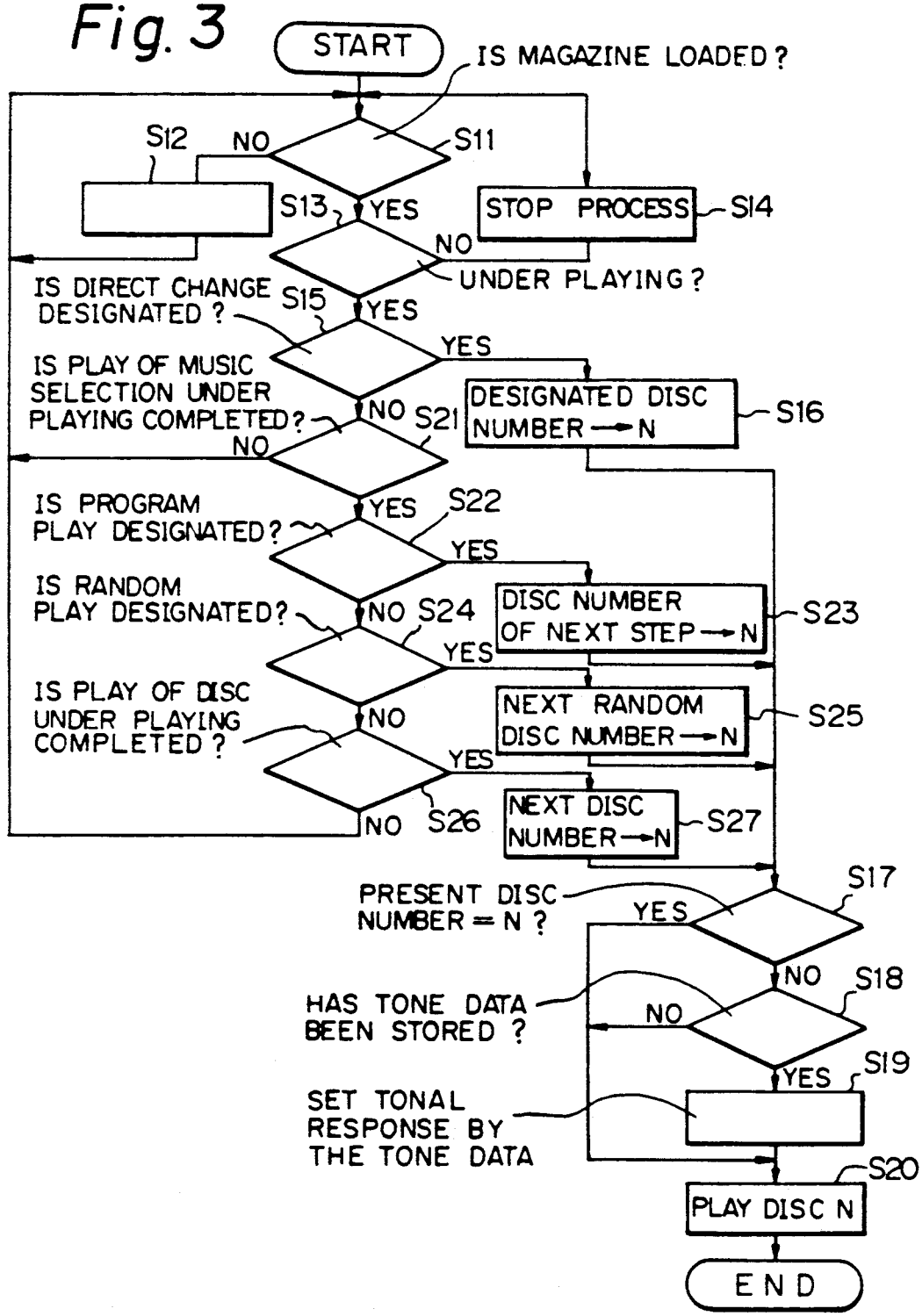

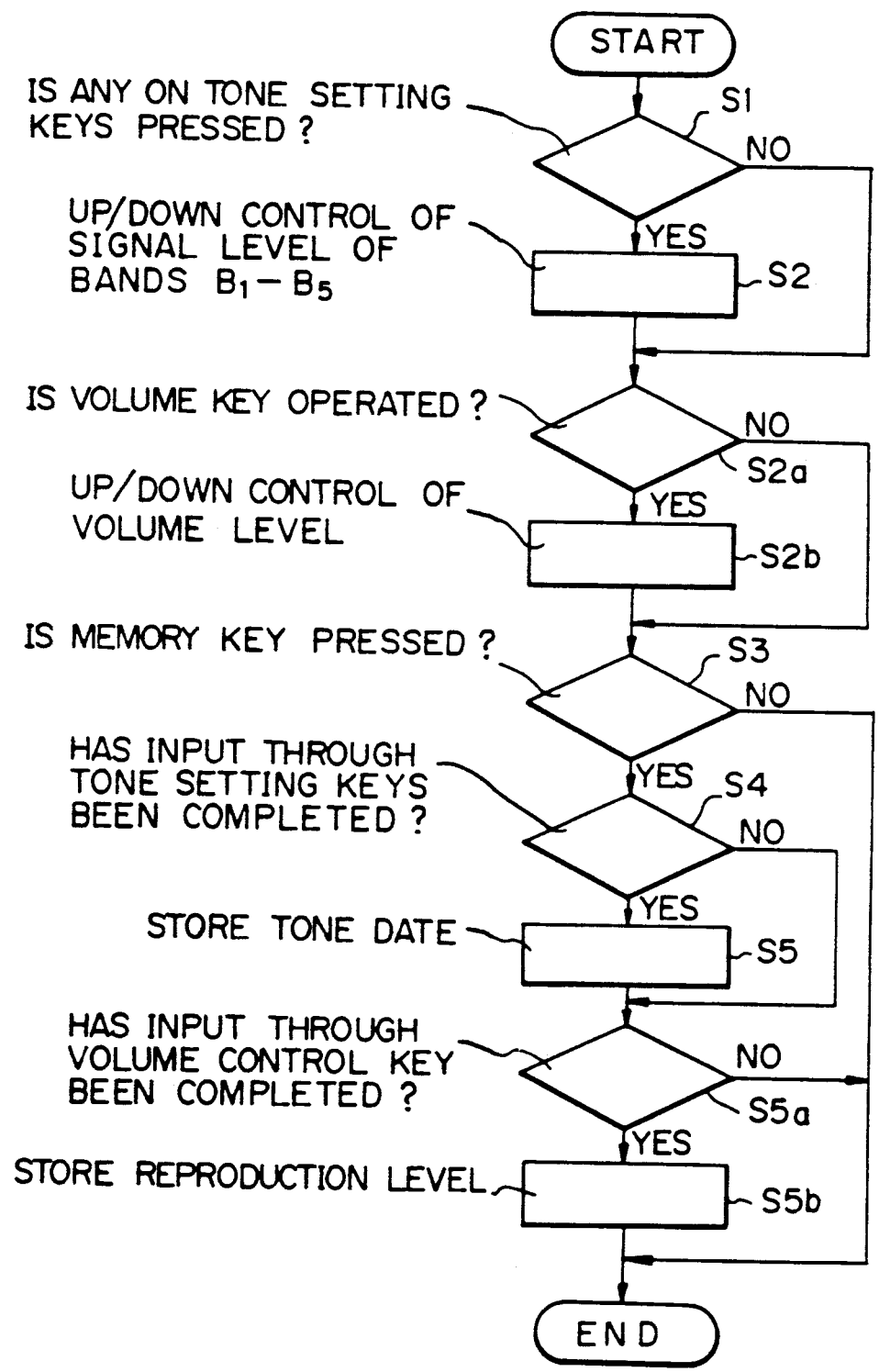

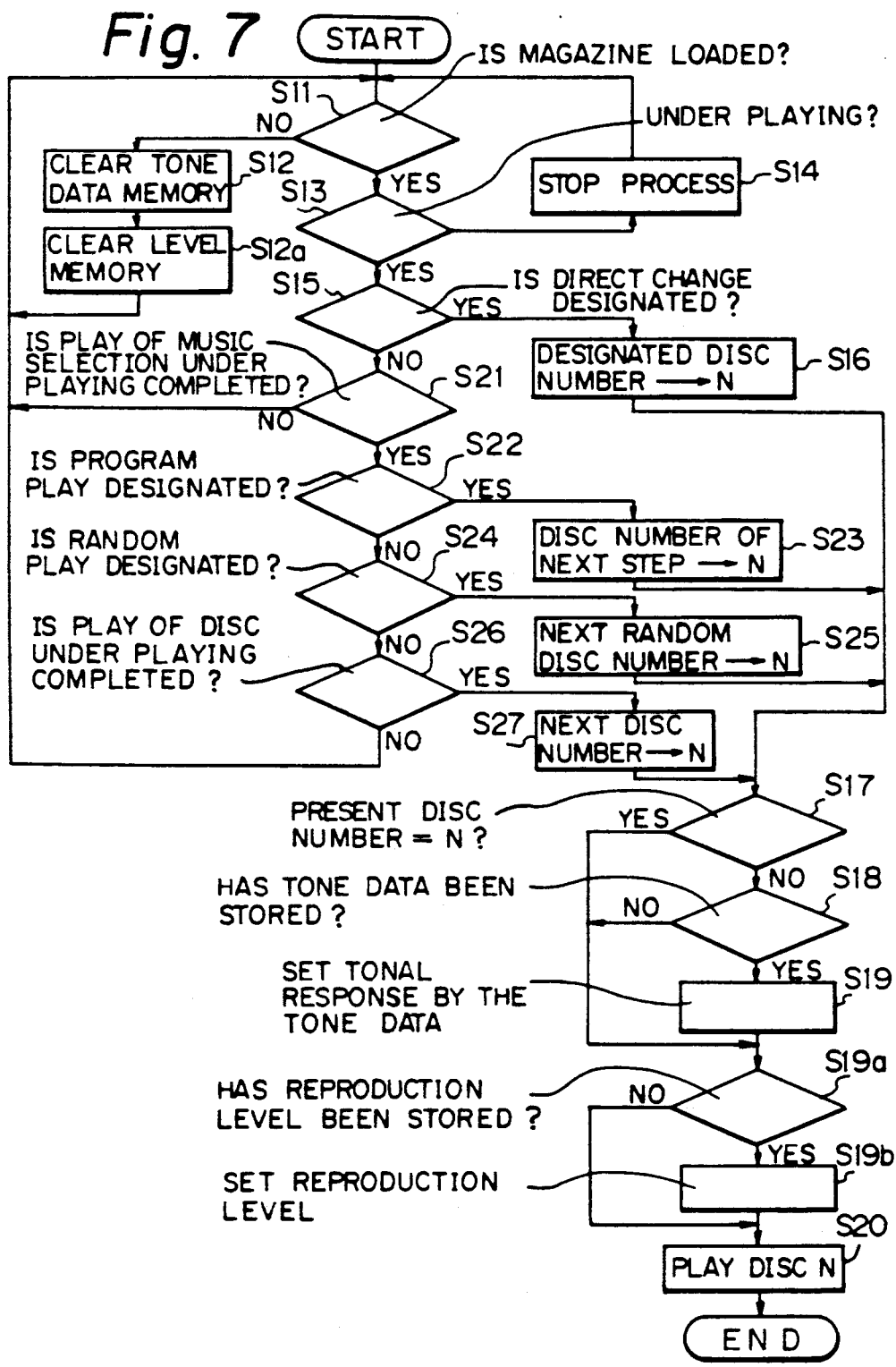

RECORDING MEDIUM PLAYING APPARATUS WITH AUTOMATIC TONAL RESPONSE SETTING FUNCTION

This is a divisional of application Ser. No. 07/442,769 filed Nov. 29, 1989.

BACKGROUND OF THE INVENTION

1. Field of the Invention

The present invention relates to an apparatus for playing recording medium, and more specifically to a recording medium playing apparatus with an automatic tonal response setting function.

2. Description of Background Information

There is a so-called multi-disc player which uses a magazine for containing a plurality of discs, i.e. recording media. By setting a plurality of discs in the magazine previously, the player is capable of performing various playing operations such as a sequential playing operation for playing a plurality of discs sequentially, a programmed playing operation for playing music selections which have been chosen previously in a sequence programmed to be heard, and a random playing operation for playing music selections randomly selected using random numbers.

On the other hand, during the reproduction of the recorded music selections, desired sound can be created more effectively if the tonal response is controlled depending on the type of the music selections recorded on the disc. For example, boosting of bass and treble ranges is effective in the case of the rhythm emphasizing remixing called "mega-mix" or "dance-mix", which is effected for the dance music, or the so-called "disco-music". If it is desired to hear music programs as the background, it is effective to make the music "soft" and less inconsonant to the ear by reducing, by little, the level of the treble signal especially in bass and treble ranges. Furthermore, by controlling the tonal response freely in accordance with the type of music, various discs can be enjoyed more effectively.

However, in the case of conventional multi-disc players, the tonal response to the reproduced sound remains unchanged unless it is adjusted by the user, so that the same tonal response is presented even when the disc is changed. Therefore, there has been an inconvenience that, if the type of music is different for each of the discs contained in the magazine, it becomes necessary to control the tonal response every time the disc is changed.

OBJECT AND SUMMARY OF THE INVENTION

The present invention is based on the recognition of the above described point, and an objective of the invention is to provide a recording medium playing apparatus in which at the time of playing the tonal response can be set automatically for each recording medium.

The recording medium playing apparatus according to the present invention is structured such that data representing variation ratios of the signal levels of frequency components in a plurality of frequency bands which are set to divide the frequency range of the audio signal, are stored as tone data correspondingly to identification information of the recording medium in response to a reproducing-tone memorizing command. At the time of playback, the tone data corresponding to the recording medium to be played are read-out on the basis of the identification information. The variation ratios represented by the tone data are designated in the tone adjusting means, to set the tonal response of the reproduced sound.

BRIEF DESCRIPTION OF THE DRAWINGS

FIGS. 2 and 3 are flowcharts showing the tonal response setting procedure in the multi-disc player shown in FIG. 1;

FIG. 4 is a diagram showing another example of the operating part 11;

FIG. 5 is a flowchart showing a tonal response setting procedure in a single disc player; and FIGS. 6 and 7 are flowcharts showing a procedure in which the volume of the reproduced sound is controlled in addition to the control of tonal response.

DETAILED DESCRIPTION OF PREFERRED EMBODIMENTS

Figure 1:
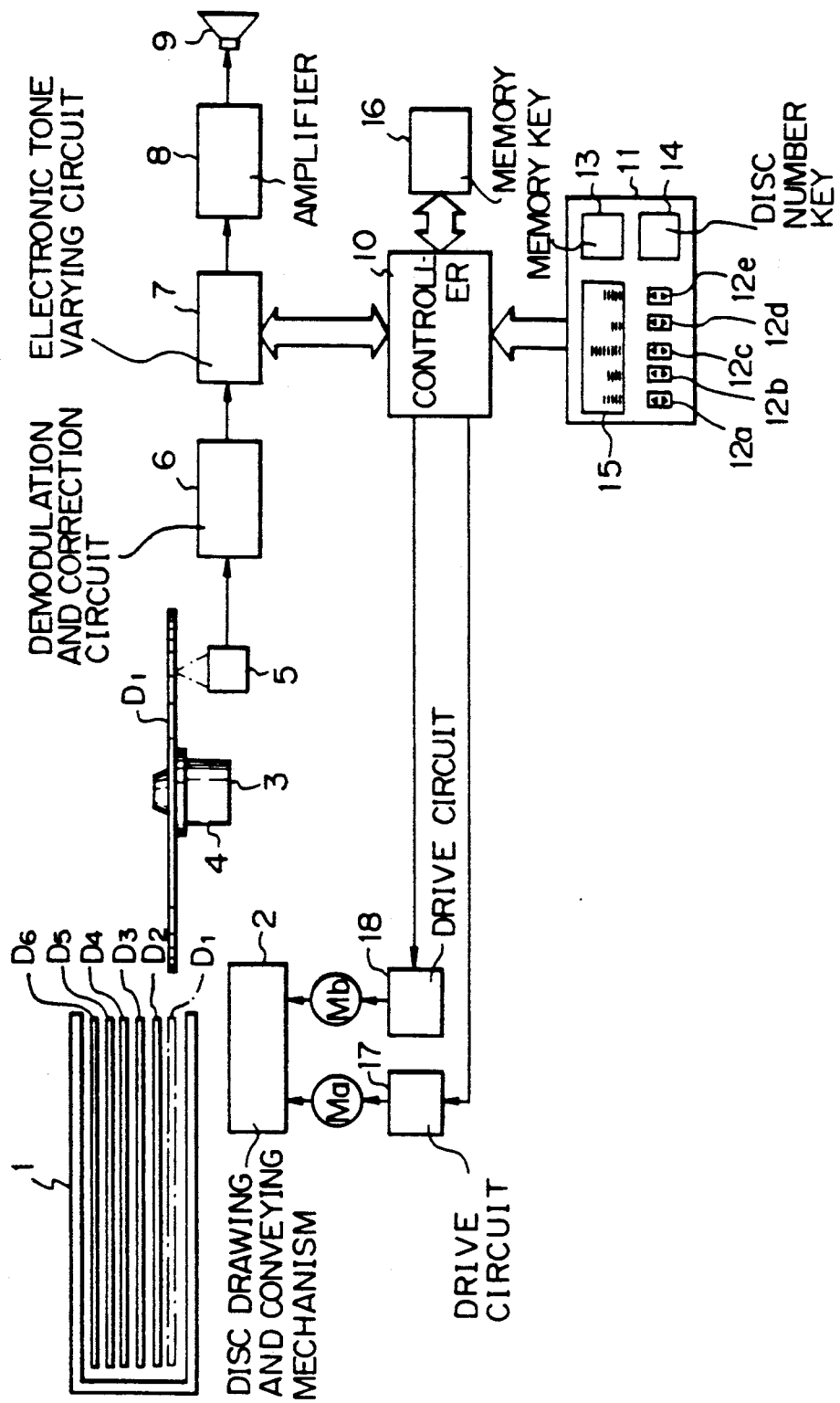
FIG. 1 is a schematic diagram showing a multi-disc player according to the present invention.

The embodiments of the present invention will be described with reference to FIGS. 1 through 7 of the accompanying drawings.

FIG. 1 is a general structural diagram showing a multi-disc player as the recording medium playing apparatus according to the present invention. In FIG. 1, there is shown a magazine 1 for housing therein six discs, for example, the discs being arranged in a stacked manner and spaced apart from each other at the pitch of a predetermined value. The magazine 1 is provided with six trays each carrying a disc, and held projectable from and retractable into the magazine 1. These trays carry six discs $D_1$ to $D_6$, respectively. The magazine 1 is detachably mounted at a predetermined mount portion of a main body, or a housing, of the player. The player is provided with a disc drawing and conveying mechanism 2 which selects a desired one of the discs $D_1$ to $D_6$ from the magazine 1 and convey the selected disc on a turntable 4 fixed to the shaft of a spindle motor 3. The thus conveyed disc is clamped on the turntable 4.

The disc drawing and conveying mechanism 2 comprises a drawing member for selecting and drawing a desired one of the trays from the magazine 1 so that a desired one of the discs housed in the trays is conveyed to the turntable 4, a clamp mechanism (not shown) for clamping the disc when it is conveyed on the turntable 4, a translating plate (not shown) for adjusting the relative position of the drawing member in a stacking direction of the discs $D_1$ to $D_6$ housed in the magazine 1 with respect to the magazine 1, and sensors (not shown) for sensing the position of the translation plate and the operation of the clamp mechanism. In the disc drawing and conveying mechanism 2, the translation plate is driven by a motor $M_a$ and the drawing member is driven by a motor Mb, respectively. The position of the drawing member is changed by the movement of the translation plate, so as to make it possible to select a desired one of the discs $D_1$ to $D_6$. The structure of the magazine 1 and the disc drawing and conveying mechanism 2 is described in detail in Japanese Patent Application Laid-Open No. 62-14369, for example.

Information recorded on the disc driven by the spindle motor 3 is read out by a pickup 5, which in turn produces a read-out RF signal. The read-out RF signal is demodulated at a demodulation and correction circuit 6 in which the demodulated signal is also treated by an error correction process. Then, the output signal of the demodulation and correction circuit 6 is supplied to an electronic tone varying circuit 7 provided as the tone control means for processing an input audio signal. For processing the audio signal there are provided five frequency bands $B_1$ through $B_5$, for example, which are selected to divide the spectrum of the audio signal into five ranges. From a controller 10, the electronic tone varying circuit 7 is supplied with data designating variation ratios of the signal levels of frequency components in the frequency bands $B_1$ through $B_5$. The center frequencies of the frequency bands $B_1$ through $B_5$ are set at 100 Hz, 330 Hz, 1 KHz, 3.3 KHz, and 10 KHz respectively.

The electronic tone varying circuit 7 is, for example, made up of a latch circuit for holding the output data of the controller 10, five band-pass filters whose passing bands are selected in accord with the frequency bands $B_1$ through $B_5$ respectively and to which the audio signal output from the demodulation and correction circuit 6 is supplied, five variable attenuation circuits for attenuating the output signals of the five band-pass filters respectively at attenuation ratios corresponding to the data held in the latch circuit, and a summing circuit for generating a sum of the output signals of the variable attenuation circuits.

The audio signal processed by this electronic tone varying circuit 7 is amplified at an amplifier 8 and reproduced by a speaker 9. Thus, the tonal response of the sound reproduced by the speaker is determined by the data held in the latch circuit in the electronic tone varying circuit 7.

The controller 10 receives various commands issued from an operating part 11. The operating part 11 consists of various parts, namely, UP/DOWN keys 12a through 12e for respectively setting the variation ratio of the signal level of the frequency component in each of the frequency bands $B_1$ through $B_5$, to set the tonal response of the playing apparatus, a memory key 13 for issuing a reproducing-tone memorizing command, a disc number key 14 for designating the number of disc to be played, a display device 15 for displaying the variation ratio of the signal level in each of the frequency bands $B_1$ through $B_5$, and a drive circuit (not shown) for driving the display device 15 in accordance with the data held in the latch circuit in the electronic tone varying circuit 7, etc.

The controller 10 is constituted by a microcomputer, which, in response to the operation of any of the UP/DOWN keys 12a through 12e in the operating part 11, supplies data designating the variation ratios of the signal levels to the electronic tone varying circuit 7 in order to control the signal levels of the frequency components in the frequency bands $B_1$ through $B_5$, respectively. When the memory key 13 is pressed and the reproducing-tone memorizing command is issued, the controller 10 retrieves from the latch circuit in the electronic tone varying circuit 7 the variation ratios of the signal levels of the frequency components in the frequency bands $B_1$ through $B_5$, and stores them as the tonal response data in a memory 16 such as RAM correspondingly to the disc number representing the order of the discs housed in the magazine 1 (the disc number is input by the operation of the disc number key 14). At the time of the playback, the controller 10 reads-out from the memory 16 the tonal response data corresponding to the disc to be played, according to the disc number. Then, the controller 10 supplies the tonal response data to the electronic tone varying circuit 7 so that the signal levels of the frequency components in the frequency bands $B_1$ through $B_5$ are varied to variation ratios indicated by the tonal response data. Furthermore, the controller 10 performs various control operations during the continuous playing operation, programmed playing operation, or the random playing operation, and controls the driving of the motors Ma and Mb through the drive circuits 17 and 18.

Referring to the flowchart of FIG. 2, the procedure for memorizing the tone of the reproduced sound which is performed by the processor of the controller 10 will be explained.

At first, the processor senses whether or not any of the UP/DOWN keys 12a through 12e operating as the tone setting keys in the operating part 11 is pressed (step S1). If it is sensed that one of the UP/DOWN keys 12a through 12e is pressed, the processor supplies data representing the variation ratio to the electronic tone-varying circuit 7 in order to increase or decrease the signal level of the frequency component by a predetermined value in one of the frequency bands $B_1$ through $B_5$ correspondingly to the one of the UP/DOWN keys 12a through 12e which has been operated (step S2).

After executing the operation in step S2, the processor senses whether or not the memory key is pressed and the reproducing-tone memorizing command is issued (in step S3). When it is sensed that the memory key 13 is pressed, the processor ascertains the input operation through any of the UP/DOWN keys 12a through 12e (step S4), and subsequently stores the data held in the latch circuit in the electronic tone varying circuit 7 at that moment into the memory 16 as the tone data correspondingly to the disc number (step S5). In the above description, it is assumed that the disc number is previously designated by the disc number keys 14 for designating disc "1" through disc "6" prior to the setting of the tonal response.

With reference to the flowchart of FIG. 3, explanation is made to the procedure for automatically controlling the tone of the reproduced sound according to the tone data stored for each disc in a manner described above.

At first, the processor judges whether or not the magazine 1 is loaded (step S11). If the magazine is not loaded, the processor clears the content of the memory in which the tone data is to be stored (step S12), and subsequently returns to step S11. If the magazine 1 is loaded, the processor judges whether or not the playing operation is taking place (step S13). If the playing operation is not taking place, the processor executes a procedure for stopping the playing operation (step S14), and subsequently returns to step S11. If, on the other hand, the playing operation is taking place, the processor judges whether or not a forcible disc change is commanded by the designation of a disc number of any one of "1" through "6" by pressing any of the disc number keys 14 (step S15). In the case of a direct change, the processor takes in the designated disc number (step S16).

Subsequently, the processor judges whether or not the designated disc number is identical with the present disc number, i.e., whether or not the designated disc number is identical with the disc number of the disc being played (step S17). If the designated disc number is different from the disc number of the disc being played, the processor judges whether or not the tone data of the designated disc has been stored in the memory 16 (step S18). If the tone data has already been stored in the memory, the processor reads out the tone data from the memory 16 according to the designated disc number, and supplies the data to the electronic tone varying circuit 7 (step S19). Subsequently, the processor proceeds to step S20 to execute the disc playing operation. When it is judged in step S17 that the designated disc is identical with the disc being played, or when it is judged in step S18 that the tone data of the designated disc is not stored in the memory 16, the processor proceeds directly to step S20, to start the disc playing operation with the presently selected tonal response.

If it is judged in step S15 that the direct change has not been designated, the processor judges whether or not the playback of the selected music selection has reached an end (step S21). If the playback of the music selection under playing has not ended, the processor returns to step S11. If the playback of the music selection under playing has been completed, the processor judges whether or not the apparatus is performing a programmed playing operation. (step S22). If the programmed playing operation is being performed, the processor retrieves the disc number of the next playback step (step S23), and proceeds to step S17, where the processor judges whether or not the disc to be played in the next step is identical with the disc being played. Subsequently, the operations of steps S18 through S20 described above will be executed.

If it is judged in step S22 that the apparatus is not performing a programmed playing operation, the processor judges whether or not a random playing operation is being performed (step S24). If the random playing operation is being performed, the processor retrieves the disc number of the disc selected by the random designation for the next playback. Then the processor proceeds to step S17, to judge whether or not the disc to be played next time is identical with the disc selected presently. Subsequently, the operations of steps S18 through S20 described above will be executed.

If it is judged in step S24 that the random playback is not taking place, the processor judges whether or not the playback of the disc under playing has completed (step S26). If the playback of the disc has not completed, the processor returns to step S11. If, on the other hand, the playback of the disc being played has completed, the processor retrieves the disc number of the disc to be played next time (step S27). Then the processor proceeds to step S17 to judge whether or not the disc to be played next time is the same as the present disc. Subsequently, the operations of the steps S18 through S20 described above will be performed.

As described in the foregoing, the tonal response of the reproduced sound is previously set for each disc and stored correspondingly to the disc number. At the time of the playing, the previously stored tonal response is selected according to the disc number, and the tonal response of the apparatus is automatically set for each disc. In this way, the user of the playing apparatus is relieved from the operation to set the tonal response every time the disc is changed. Therefore, in the case where the type of music is different among the discs housed in the magazine 1, the music can be reproduced more effectively without the necessity of adjusting the tonal response every time the disc is changed, if the tonal response of the reproduced sound is previously set and stored for each disc according to the type of music selections recorded on the disc.

In the embodiment described above, the frequency range of the audio signal is divided by five to set the frequency bands $B_1$ through $B_5$, and the tonal response is controlled by varying the signal levels in the frequency bands $B_1$ through $B_5$. However, this is not limitative, and the number of division of the frequency range of the audio signal can be selected from any number greater than one. For example, the frequency range of the audio signal may be divided into two frequency bands, e.g., a bass band below 1 KHz and a treble band above 1 KHz. It is needless say that the number of the UP/DOWN keys in the operating part 11, the number of the bandpass filters and the variable attenuation circuit in the electronic tone varying circuit 7 can be reduced to two if the frequency range of the audio signal is divided by two.

Furthermore, in the embodiment described above, the variation ratio of the signal level of the frequency component in each of the frequency bands $B_1$ through $B_5$ is designated by using the UP/DOWN keys. However, as illustrated in FIG. 4, it is also possible to use a plurality of variable resistances with operating buttons $20a$ through $20e$ arranged to generate voltage levels corresponding to the position of the operating buttons $20a$ through $20e$ respectively. By using such variable resistances, the variation ratios of the signal levels of the frequency components in the frequency bands $B_1$ through $B_5$ can be designated. Furthermore, the display device 15 may be eliminated because the variation ratio of the signal level of the frequency component in each of the frequency bands $B_1$ through $B_5$ can by recognized by the position of each of the operating buttons $20a$ through $20e$.

The present invention is embodied in a multi-disc player in the above explanation. However, the invention is also applicable to a single disc player. In the case of the single disc player, the TOC (table of content) information read from the disc is used as disc identification information, and it is sufficient to store the tonal response set for each disc and the corresponding TOC information in the form of pairs. The playback sequence is as shown in the flowchart of FIG. 5. A set-up process for the loaded disc is performed at first (step S31). Then, the TOC information of the disc is read (step S32), and the processor of the controller judges whether or not the tone data of the disc identified by the read-out TOC data has been stored (step S33). If the tone data of the disc has been stored, then the processor reads-out the stored tone data according to the TOC information and supplies them to the electronic tone varying circuit 7 (step S34). After these operations, the processor proceeds to the search and play operations. If, on the other hand, the tone data of the disc to be played is not stored, the processor directly proceeds to the search and play operations without changing the tone data set in the electronic tone varying circuit 7 at that time.

The present invention has been described by way of the example of disc players. However, the invention is also applicable to a tape deck. In the case of the tape deck, the tape cassette can be identified by attaching a bar-code on the casing of cassette tape as the identification information of the cassette tape.

In the embodiment described above, the tone data is recorded correspondingly to the identification information of the recording medium. However, it is also possible to modify the apparatus such that the tone data is recorded together with the program content for each program to be played.

In the above embodiment, only the tonal response of the apparatus is controlled. It is also conceivable to control the volume of the reproduced sound together with the tone control operation. With such a feature, the sound creation can be effected more freely. In order to realize such an arrangement, it is preferable to provide, for example, an electronic volume control between the electronic tone varying circuit 7 and the amplifier 8 of the arrangement shown in FIG. 1, and an UP/DOWN key for volume control in the operating part 11. The procedure for memorizing the tonal response and the sound level and the procedure for automatically setting them which are performed by the processor of the controller 10 in this case may be as shown in the flowcharts of FIGS. 6 and 7.

In the flowchart of FIG. 6, steps for executing operations the same as those shown in the flowchart of FIG. 2 are denoted by the same reference numerals, and the explanation thereof will not be repeated. As shown in FIG. 6, after the execution of the step S2 the processor senses whether or not the UP/DOWN key for volume control is pressed (step S2a). If it is sensed that the UP/DOWN key is pressed, the processor drives the electronic volume control to increase or decrease the sound level (step S2b). Step S3 is executed subsequently. After the execution of step S5, the processor ascertains the input operation through the UP/DOWN key (step S5a). Then, the processor stores the sound level at the moment into memory 16 correspondingly to the disc number (step S5b).

In the flowchart of FIG. 7, steps for executing operations the same as those shown in the flowchart of FIG. 3 are denoted by the same reference numerals, and the explanation thereof will not be repeated. As shown in FIG. 7, after the execution of step S12 the processor clears memory in which the reproduction level is to be stored (step S12a), and returns to step S11. In addition, after the execution of step S19, the processor judges whether or not data of the reproduction level of the designated disc has been stored in memory 16 (step S19a). If the data of the reproduction level has been stored, the processor reads-out from the memory 16 the reproduction level of the disc according to the designated disc number and sets them to determine the reproduction level (step S19b). Then the processor executes the step S20.

As specifically described above, in the disc playing apparatus according to the present invention data representing variation ratios of the signal levels of frequency components in a plurality of frequency bands which are set to divide the frequency range of the audio signal, are stored as tone data correspondingly to the identification information of the recording medium in response to the reproducing-tone memorizing command. At the time of playback, the tone data corresponding to the recording medium to be played are read-out on the basis of the identification information. The variation ratios represented by the tone data are designated in the tone adjusting means, to set the tonal response of the reproduced sound. Thus, the tonal response is automatically set for each recording medium, and the need for the user to adjust the tonal response every time the recording medium is changed. This feature is very convenient for the reproduction of sound from a recording medium.

Especially, in playing apparatuses arranged to change the recording medium automatically, there may be cases in which the type of music is different from each other among the recording media. In such cases, by setting the tonal response appropriately for each recording medium, it is possible to avoid the generation of disagreeable aural feelings which might be caused by an inappropriate setting of the tonal response with respect to the type of the recorded music selections every time the recording medium is changed.

What is claimed is:

1. An apparatus for playing recording media carrying audio signals, comprising:
   a storing part for simultaneously storing a plurality of recording medium of a similar shape, wherein each recording medium is stored in separate positions within the storing part;
   a tone response control means for controlling the tone of sounds reproduced from said audio signals, by controlling signal levels of frequency components in a plurality of frequency bands, which are set to divide the frequency range of said audio signals, to designated variation ratios;
   a memory means;
   a command means for generating a reproducing-tone memorizing command and said variation ratios of said signal levels;
   a memory control means for storing, in response to said reproducing-tone memorizing command, data representing said variation ratios in said memory means corresponding to identification information of each of said recording media, said data representing said variation ratios being stored as tone data sets, wherein each of said data sets is associated with a unique identification code and each of said identification codes is associated with one of said separate storing positions; and
   a tone response setting means for reading out said tone data sets dependent upon which identification code is selected, said selected identification code corresponding to a selected storing position of a selected recording medium to be played, and subsequently supplying said variation ratios represented by said read out tone data set to said tone response control means, thereby setting the tone of the reproduced sound, wherein said tone response setting means automatically changes the readout tone data to correspond with an automatic change of the selected storing position.

2. The apparatus of claim 1, further comprising preprogram means for recording the order in which said storing positions are to be selected, wherein all of recording media stored in said storing positions may be played without manual interference.

3. The apparatus of claim 1, further comprising memory means for storing a volume setting corresponding to each of said identification codes, wherein the volume setting is automatically changed to correspond with an automatic change of the selected storing position.

4. The apparatus of claim 1, wherein said recording media are compact disk or laser disk.

* * * * *